United States Patent
Huang et al.

(10) Patent No.: US 8,828,842 B2
(45) Date of Patent: Sep. 9, 2014

(54) CRACK STOP STRUCTURE AND METHOD FOR FORMING THE SAME

(71) Applicant: Nanya Technology Corp., Tao-Yuan Hsien (TW)

(72) Inventors: Tse-Yao Huang, Taipei (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 14/172,919

(22) Filed: Feb. 5, 2014

(65) Prior Publication Data
US 2014/0154864 A1 Jun. 5, 2014

Related U.S. Application Data

(62) Division of application No. 13/214,227, filed on Aug. 21, 2011.

(51) Int. Cl.
 H01L 21/762 (2006.01)
 H01L 23/00 (2006.01)
 H01L 23/58 (2006.01)

(52) U.S. Cl.
 CPC ........ H01L 21/76224 (2013.01); H01L 23/562 (2013.01); H01L 2924/0002 (2013.01); H01L 23/585 (2013.01)
 USPC .......................................... 438/424

(58) Field of Classification Search
 CPC .... H01L 23/585; H01L 23/562; H01L 23/564
 USPC .......... 438/462, 424, 430, 700, 129; 257/620, 257/48, 618, 534, 622
 See application file for complete search history.

(56) References Cited

U.S. PATENT DOCUMENTS

| 8,373,254 B2 | 2/2013 | Chen |
| 2008/0230874 A1 | 9/2008 | Yamada |
| 2010/0006984 A1* | 1/2010 | Watanabe et al. ............. 257/639 |

* cited by examiner

Primary Examiner — Whitney T Moore
(74) Attorney, Agent, or Firm — Winston Hsu; Scott Margo (57) ABSTRACT

The present invention in a first aspect proposes a semiconductor structure with a crack stop structure. The semiconductor structure includes a matrix, an integrated circuit and a scribe line. The matrix includes a scribe line region and a circuit region. The integrated circuit is disposed within the circuit region. The scribe line is disposed within the scribe line region and includes a crack stop trench which is disposed in the matrix and adjacent to the circuit region. The crack stop trench is parallel with one side of the circuit region and filled with a composite material in the form of a grid to form a crack stop structure.

9 Claims, 10 Drawing Sheets

CRACK STOP STRUCTURE AND METHOD FOR FORMING THE SAME

CROSS REFERENCE TO RELATED APPLICATIONS

This is a division of U.S. application Ser. No. 13/214,227 filed Aug. 21, 2011, which is included in its entirety herein by reference.

BACKGROUND OF THE INVENTION

1. Field of the Invention

The present invention generally relates to a crack stop structure and a method for forming a crack stop structure in a scribe line. In particular, the present invention is directed to a composite crack stop structure and a method for forming the composite crack stop structure in a scribe line.

2. Description of the Prior Art

Semiconductor manufacturers have been trying to shrink the size of transistors in integrated circuits (IC) to improve chip performance. This has resulted in an increased speed and device density. For sub-micron technology, the RC delay becomes the dominant factor. To facilitate further improvements, semiconductor IC manufacturers have been forced to turn to new materials for reducing the RC delay by either lowering the interconnect wire resistance, or by reducing the capacitance of the inter-layer dielectric (ILD) material. A significant improvement was achieved by replacing aluminum (Al) interconnects with copper, which has ~30% lower resistivity than that of Al. Further advances may be accomplished by changing the low-k dielectric materials.

In prior art aluminum interconnect technology, when Al forms a self-passivating oxide layer, a crack stop is formed to prevent cracks from traversing the BEOL dielectrics into the IC chip. One shortcoming associated with the use of low-k dielectrics is that almost all low-k dielectric materials possess a lower mechanical strength than that of conventional silicon oxide dielectrics such as FSG or USG.

The use of low-k dielectrics poses another problem for the industry in that the adhesion ability, either at the interface between two adjacent low-k dielectric layers or at the interface between a low-k dielectric layer and a dissimilar dielectric layer, is inadequate to meet the requirements of subsequent wafer treatment processes such as wafer dicing, which is typically performed to mechanically cut a semiconductor wafer into a number of individual IC chips.

The technology of dicing has been developed to a high standard. One restriction of dicing is the resulting cracks extending laterally from the dicing line into the semiconductor and insulating materials. Following these cracks, moisture and contamination are free to penetrate active circuitry and will start degrading the electrical device performance by a drastic amount. Even today, this generation of cracks creates the most significant limitation with respect to minimizing circuit chips. In addition, those cracks also represent significant reliability risks, since they tend to grow and widen under thermal and mechanical stress and thus eventually imperil the functionality of the integrated circuit.

It has been found that the so-called "interface de-lamination" phenomenon occurs between low-k dielectric layers during or after the wafer dicing process is performed, causing performance degradation of the IC chips. In light of the above, there is still a need in this industry for a solution to the undesired propagation of the interface de-lamination between low-k dielectric layers originating from the wafer dicing process.

SUMMARY OF THE INVENTION

The present invention in a first aspect proposes a semiconductor structure with a crack stop structure. The semiconductor structure includes a matrix, an integrated circuit and a scribe line. The matrix includes a scribe line region and a circuit region. The integrated circuit is disposed within the circuit region. The scribe line is disposed within the scribe line region and includes a crack stop trench which is disposed in the matrix and adjacent to the circuit region. The crack stop trench is parallel with one side of the circuit region and filled with a composite material in a form of a grid to form a crack stop structure.

In one embodiment of the present invention, the composite material includes a metal and an insulating material.

In another embodiment of the present invention, the composite material includes a first insulating material and a second insulating material. The metal may include at least one of Cu, Al or W, and the insulating material may include at least one of a porous low k material, polyimide, silicon oxide, silicon nitride or silicon oxynitride.

In another embodiment of the present invention, the metal is in the form of a plurality of strips.

In another embodiment of the present invention, the semiconductor structure may further include a test pad disposed within the scribe line region so that the crack stop trench is disposed between the test pad and the circuit region.

In another embodiment of the present invention, the semiconductor structure may further include a guard ring surrounding the integrated circuit.

In another embodiment of the present invention, the matrix may include at least one of an interlayer dielectric layer, an intermetal dielectric layer and a shallow trench isolation so that the crack stop trench penetrates at least one of the interlayer dielectric layer, the intermetal dielectric layer and the shallow trench isolation to be embedded in the matrix.

In another embodiment of the present invention, the crack stop trench has a trench width at least one tenth of the line width of the scribe line.

In another embodiment of the present invention, the semiconductor structure may further include a side crack stop trench embedded in the matrix and filled with composite material so that the crack stop trench is disposed between the side crack stop trench and the circuit region.

The present invention in a second aspect proposes a method for forming a crack stop structure in a scribe line. First, a substrate including a scribe line region and a circuit region is provided. An integrated circuit is formed within the circuit region. Then, a first layer is formed to be embedded in the substrate. The first layer is partially disposed within the scribe line region. An interlayer dielectric layer is formed to be disposed on the substrate and to cover the integrated circuit and the first layer. A second layer is then formed to be embedded in the substrate. The second layer is partially disposed within the scribe line region. An intermetal dielectric layer is formed to be disposed on the interlayer dielectric layer and to cover the second layer. Subsequently, the interlayer dielectric layer and the intermetal dielectric layer which are disposed within the scribe line region are removed to form a crack stop trench. Thereafter, the crack stop trench is filled with a dielectric material to form a crack stop structure.

In one embodiment of the present invention, the dielectric material includes at least one of a porous low k material, polyimide, silicon oxide, silicon nitride or silicon oxynitride.

In another embodiment of the present invention, the crack stop trench has a trench width at least one tenth of the line width of the scribe line.

In another embodiment of the present invention, the first layer within the scribe line region has an orientation vertical to that of the second layer within the scribe line region to form a metal grid.

In another embodiment of the present invention, the first layer within the scribe line region and the second layer within the scribe line region are arranged together in the form of a check board.

In another embodiment of the present invention, the method for forming a crack stop structure in a scribe line may further include forming a test pad disposed within the scribe line region so that the crack stop trench is disposed between the test pad and the circuit region.

In another embodiment of the present invention, the method for forming a crack stop structure in a scribe line may further include forming a guard ring surrounding the integrated circuit.

In another embodiment of the present invention, removing the interlayer dielectric layer and the intermetal dielectric layer may further include removing a shallow trench isolation disposed in the substrate.

In another embodiment of the present invention, the method for forming a crack stop structure in a scribe line may further include forming a side crack stop trench by removing the interlayer dielectric layer and the intermetal dielectric layer, and filling the side crack stop trench with the dielectric material to form a side crack stop structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
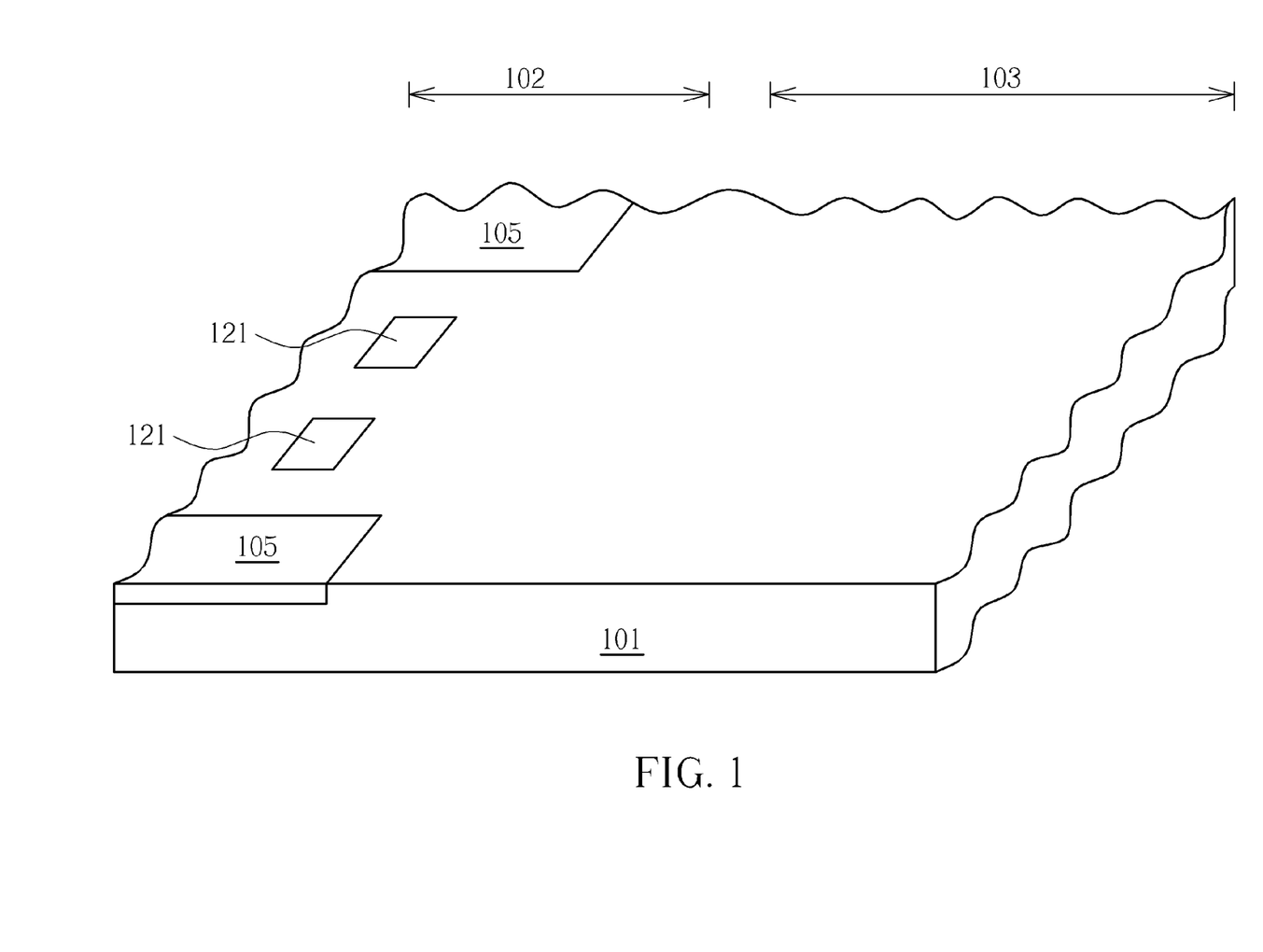
FIGS. 1-8 illustrate a method for forming a crack stop structure in a scribe line of the present invention.

The present invention in a first aspect provides a method for forming a crack stop structure in a scribe line. FIGS. 1-8 illustrate a method for forming a crack stop structure in a scribe line of the present invention. First, as shown in FIG. 1, a substrate 101 is provided. The substrate 101 may be a semiconductive material, such as Si, and includes at least two regions, namely a scribe line region 102 and a circuit region 103. The circuit region 103 is used to accommodate an integrated circuit such as a MOS device or a flash memory cell. The scribe line region 102 is used to accommodate a scribe line for dicing the substrate 101. Optionally, a shallow trench isolation 105 may be formed in the substrate 101.

Figure 2:
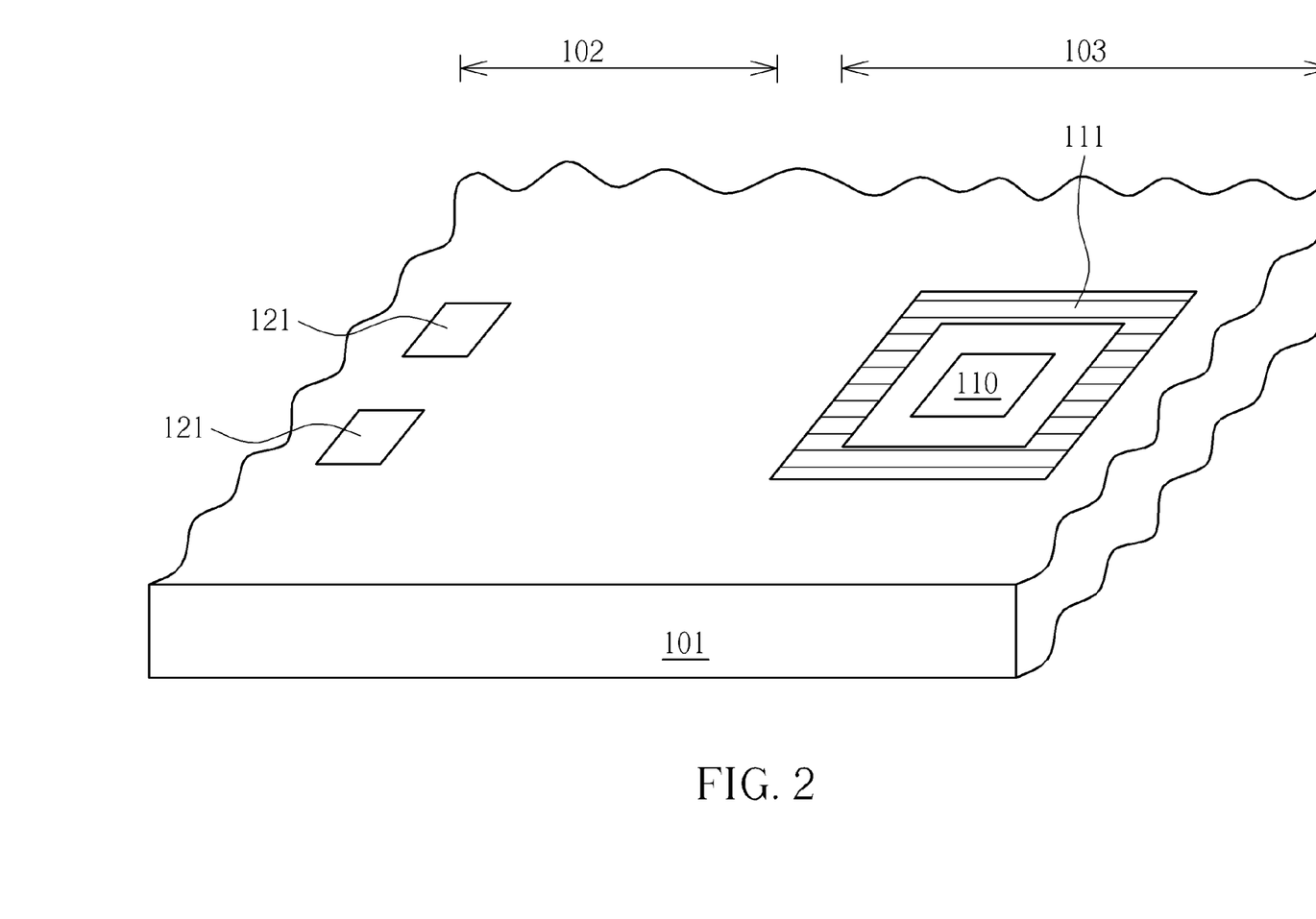

Since the circuit region 103 is used to accommodate an integrated circuit 110, as shown in FIG. 2, an integrated circuit 110 is formed within the circuit region 103. Optionally, a guard ring 111 may be formed to surround and to protect the integrated circuit 110. Alternatively, a test pad 121 may be formed in the scribe line 102 on the substrate 101 for testing various circuits.

Figure 3:
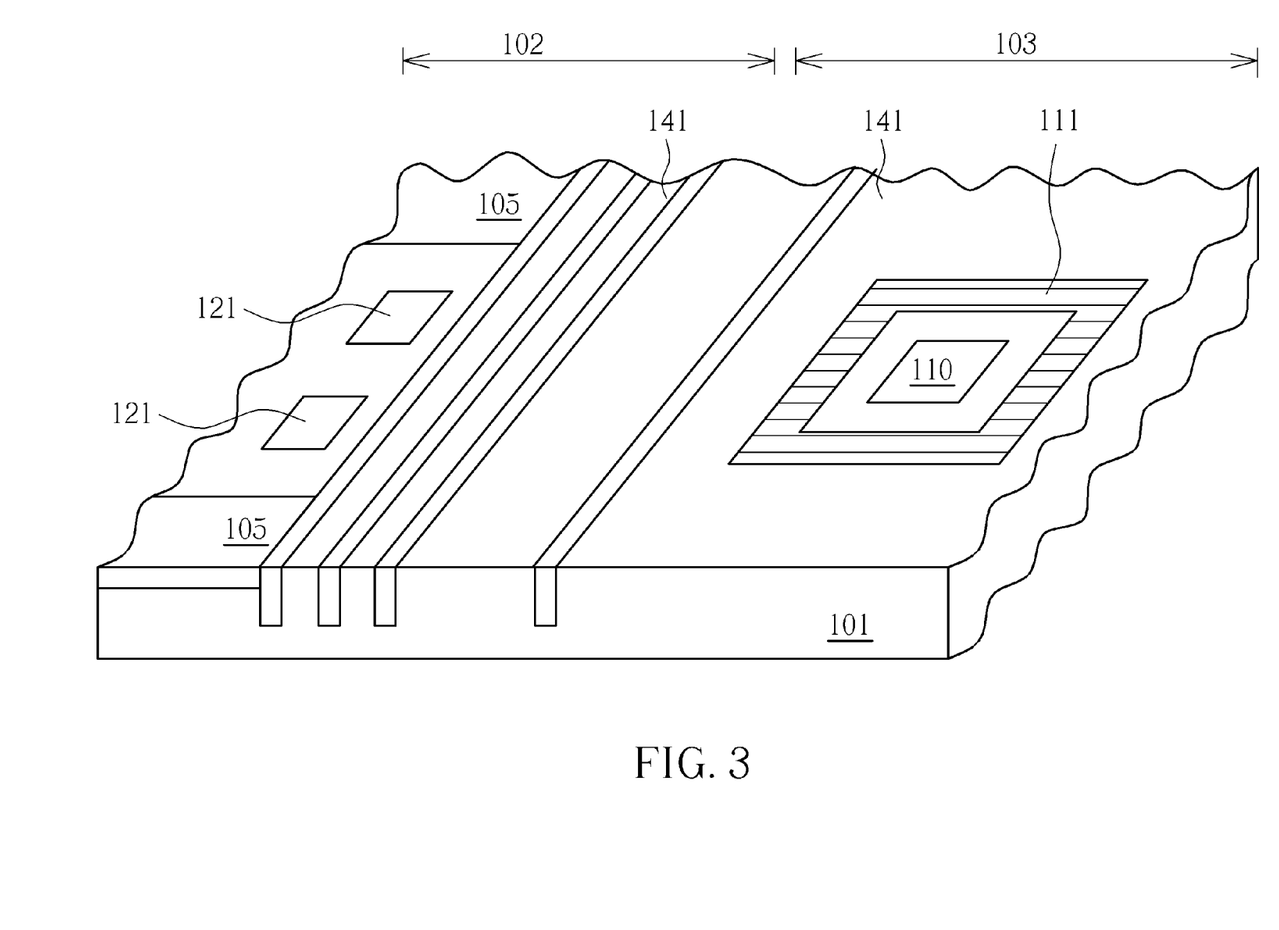

As shown in FIG. 3, a first layer 141 is embedded in the substrate 101. In particular, part of the first layer 141 is disposed within the scribe line region 102. The first layer 141 may be formed by a conventional damascene process: for example, the first layer 141 may include a conductive material such as Si or a metal such as Cu, Al or W. Alternatively, the first layer 141 may also include an insulating material such as at least one of a porous low k material, polyimide, silicon nitride and silicon oxynitride.

If the first layer 141 within the scribe line region 102 and the first layer 141 within the circuit region 103 respectively include different materials, the following procedures may be used. First, a plurality of recesses (not shown) are formed. The recesses are filled with a first material to form the first layer 141. The first layer 141 within the scribe line region 102 are protected by a photoresist (not shown) and the first layer 141 within the circuit region 103 are exposed and removed by an etching procedure to obtain the recess again. The recess is filled with a second material different from the first material to form the first layer 141' of different material. FIG. 3 illustrates the first layer 141 and the first layer 141'.

One function of the first layer 141 is that it may serve as the electrical interconnection. Another function of the first layer 141 within the scribe line region 102 is one of the features of the present invention, namely serving as one of the frameworks for the crack stop structure of the present invention. In one embodiment of the present invention, the first layer 141 may be in the form of a plurality of strips so the first layer 141 may serve as one of the frameworks for the crack stop structure of the present invention.

Figure 4:
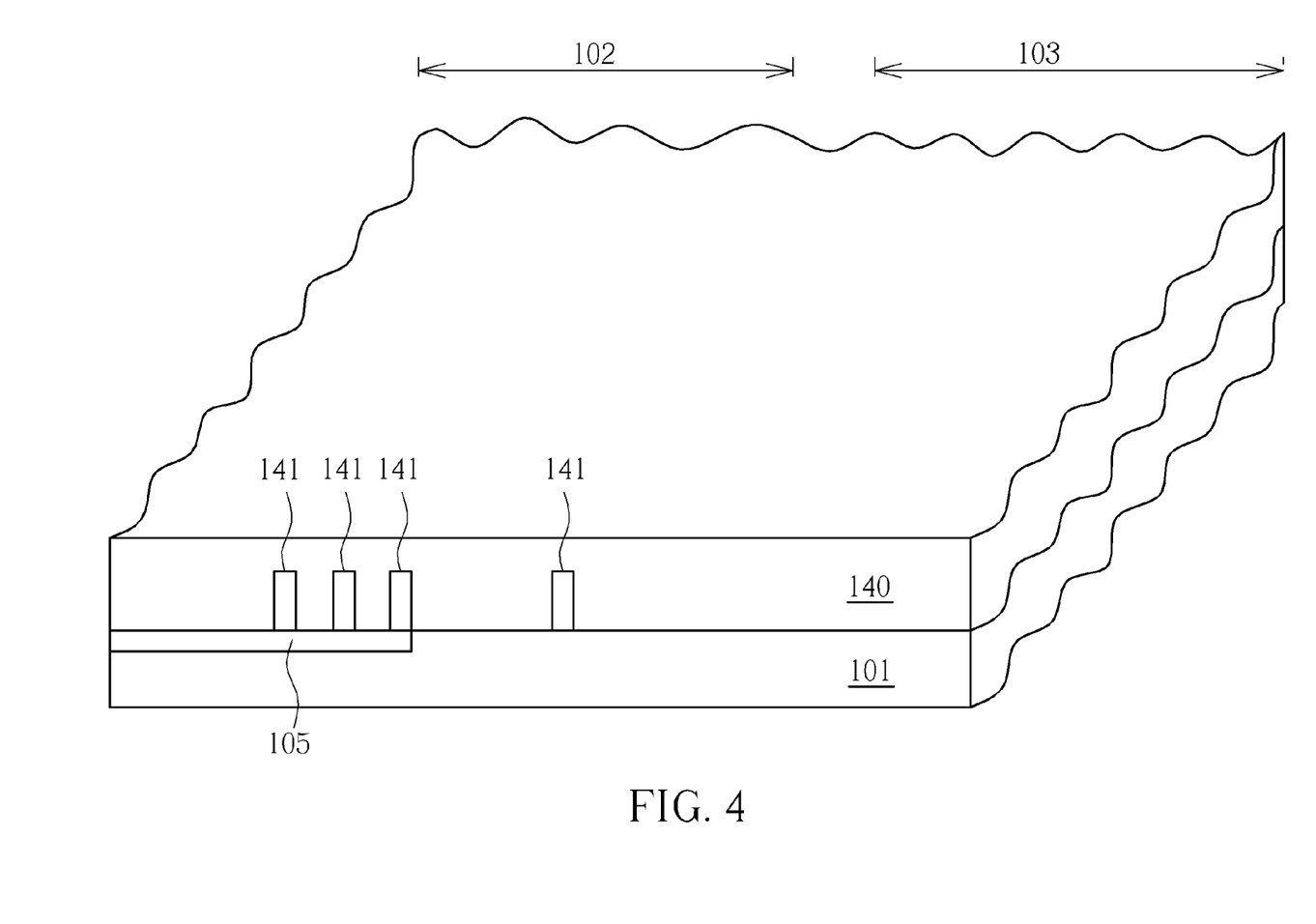

Then, as shown in FIG. 4, an interlayer dielectric layer 140 is formed to be disposed on the substrate 101 and cover the integrated circuit 110 and the first layer 141. The interlayer dielectric layer 140 may include an insulating material or a dielectric material, such as one or more of a porous low k material, polyimide, silicon oxide, silicon nitride and silicon oxynitride, and may be formed by chemical vapor deposition such as low pressure CVD (LP-CVD), atmosphere pressure CVD (AP-CVD) or plasma Enhanced CVD (PE-CVD). FIG. 4 illustrates the first layer 141 alone.

Figure 5A:
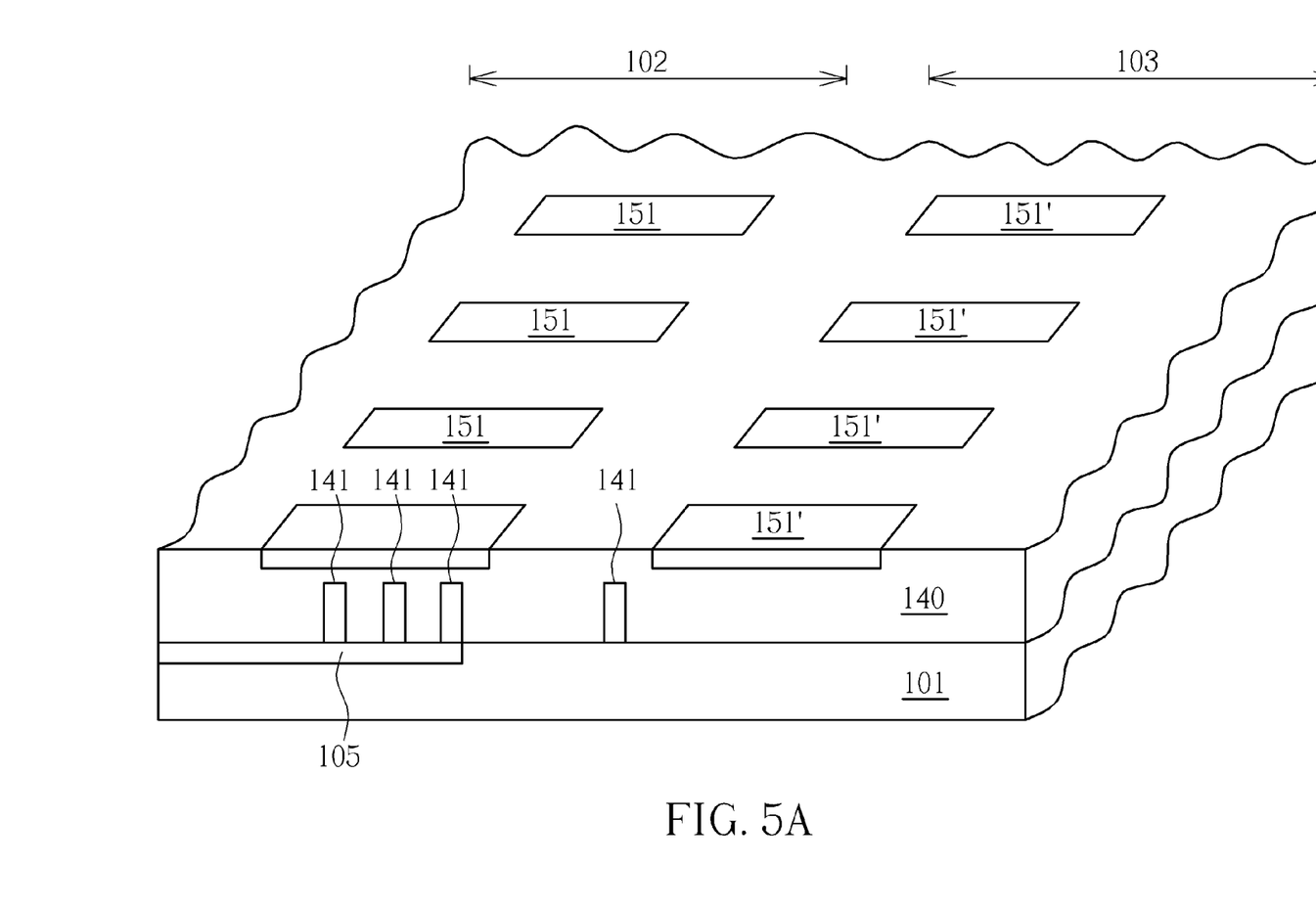
Figure 5B:
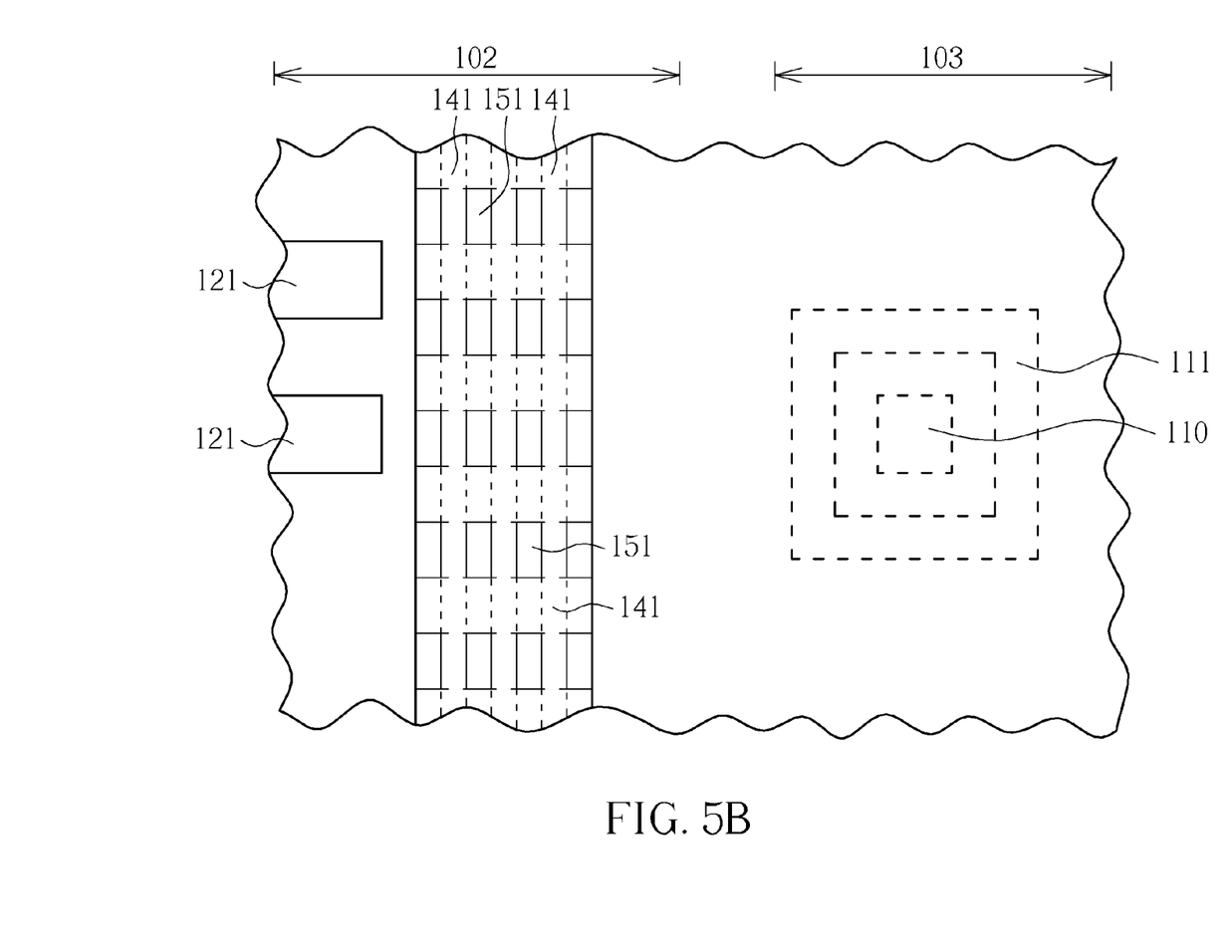

As shown in FIG. 5, another layer, i.e. a second layer 151 is formed on the substrate 101 and is embedded in the interlayer dielectric layer 140. The second layer 151 may also be partially disposed within the scribe line region 102. The second layer 151 may be formed by a conventional damascene process and by chemical vapor deposition such as low pressure CVD (LP-CVD), atmosphere pressure CVD (AP-CVD) or plasma Enhanced CVD (PE-CVD). For example, the second layer 151 may includes a conductive material such as Si or a metal such as Cu, Al or W. Alternatively, the second layer 151 may also include an insulating material such as at least one of a porous low k material, polyimide, silicon nitride and silicon oxynitride.

One function of the second layer 151 is that it may serve as the electrical interconnection. Another function of the second layer 151 within the scribe line region 102 is another feature of the present invention, namely serving as another of the frameworks for the crack stop structure of the present invention.

If the second layer 151 within the scribe line region 102 and the second layer 151 within the circuit region 103 respectively include different materials, the following procedures may be used. First, a plurality of recesses (not shown) are formed. The recesses are filled with a first material to form the second layer 151. The second layer 151 within the scribe line region 102 is protected by a photoresist (not shown) and the second layer 151 within the circuit region 103 is exposed and removed by an etching procedure to obtain the recess again. Later, the recess is filled with a second material different from the first material to form the second layer 151' of different material. FIG. 5 illustrates the second layer 151 and the second layer 151'.

In one embodiment of the present invention, the second layer 151 may be in the form of a plurality of strips so the second layer 151 may serve as one of the frameworks for the crack stop structure of the present invention. Preferably, however, the first layer 141 within the scribe line 102 region has an orientation vertical to that of the second layer 151 within the scribe line region 102 to form a metal grid 104, as shown in FIG. 5.

In another embodiment of the present invention, the first layer 141 within the scribe line region 102 and the second layer 151 within the scribe line region 102 may be arranged together in the form of a check board. FIG. 5A illustrates a top view of such an embodiment.

Figure 6:
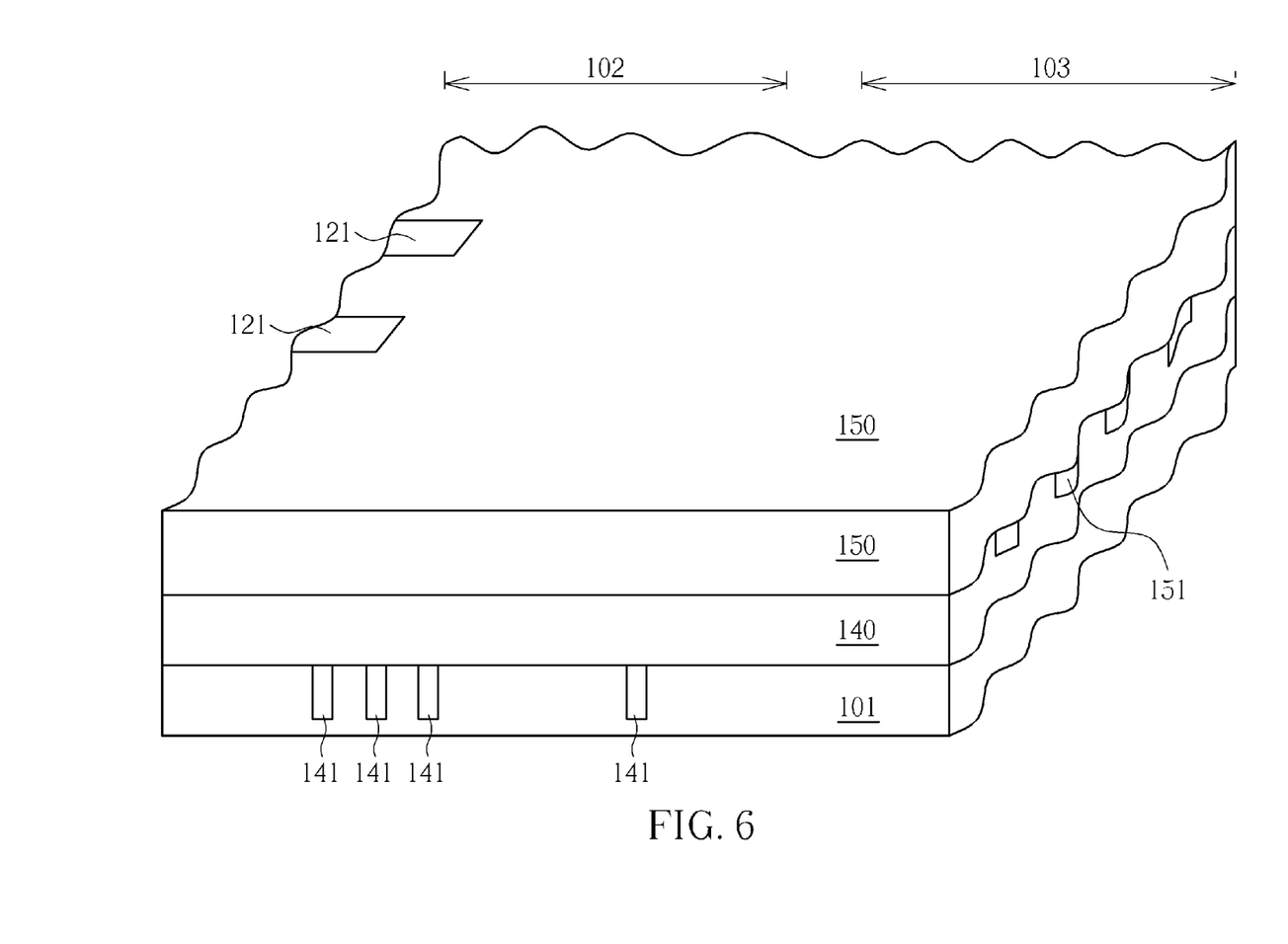

Next, as shown in FIG. 6, an intermetal dielectric layer 150 is formed to be disposed on the interlayer dielectric layer 140 and cover the second layer 151. A scribe line 120 is defined within the scribe line region 102 on the intermetal dielectric layer 150. There may be multiple intermetal dielectric layers 150 disposed on the interlayer dielectric layer 140 but only one layer is illustrated in FIG. 6 for simplicity. The second layer 151 may also include an insulating material or a dielectric material such as a porous low k material, polyimide, silicon oxide, silicon nitride or silicon oxynitride.

Figure 7:
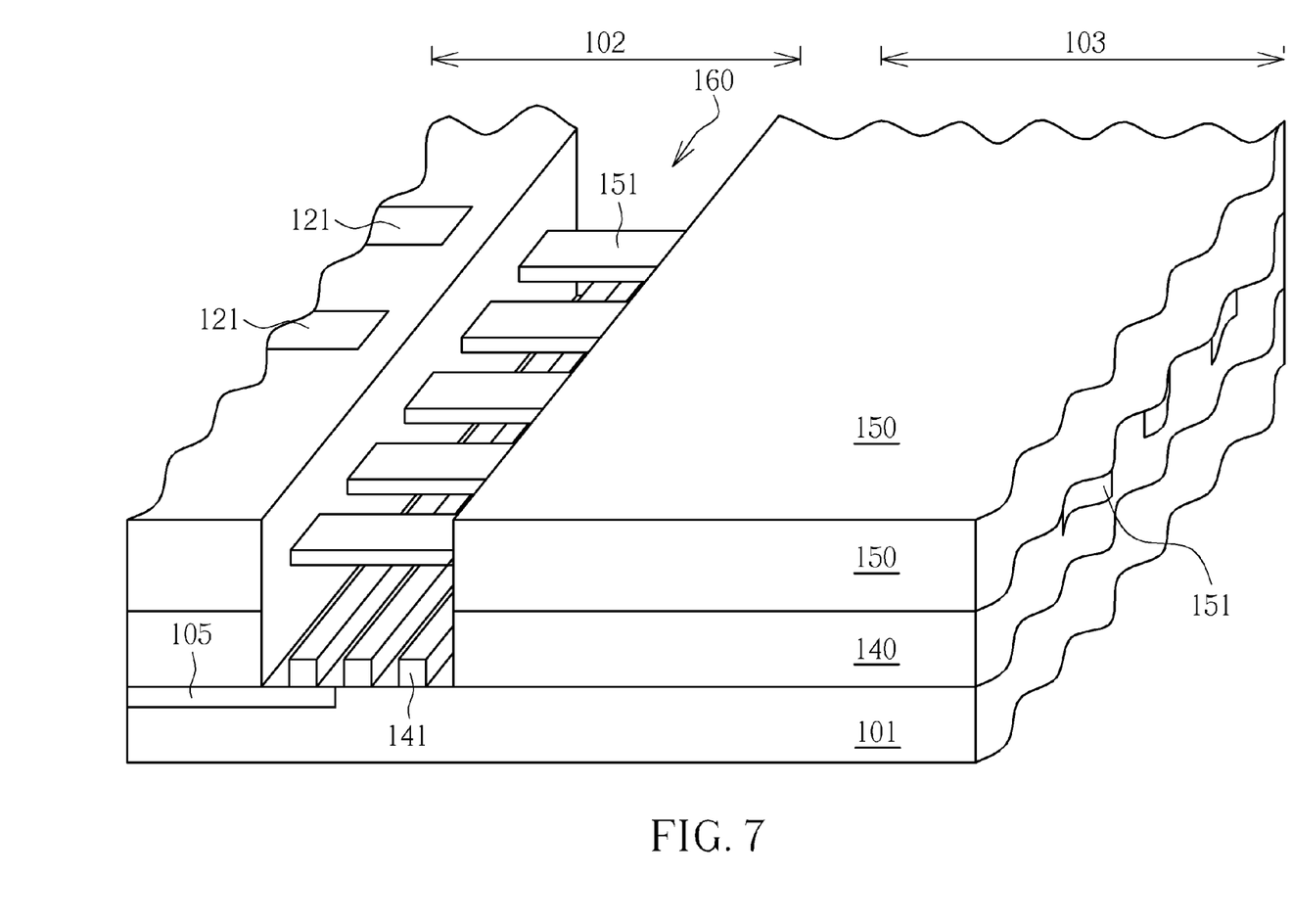

Subsequently, as shown in FIG. 7, some of the interlayer dielectric layer 140 and some of the intermetal dielectric layer 150 which are disposed within the scribe line region 102 are removed to form a crack stop trench 160. When the interlayer dielectric layer 140 and the intermetal dielectric layer 150 are one of the insulating material or the dielectric material, the interlayer dielectric layer 140 and the intermetal dielectric layer 150 may be removed isotropically and anisotropically by a dry etching. The etchant for the etching may include fluoride, chloride, $SF_6$ or sulfur-containing gas.

Figure 8:
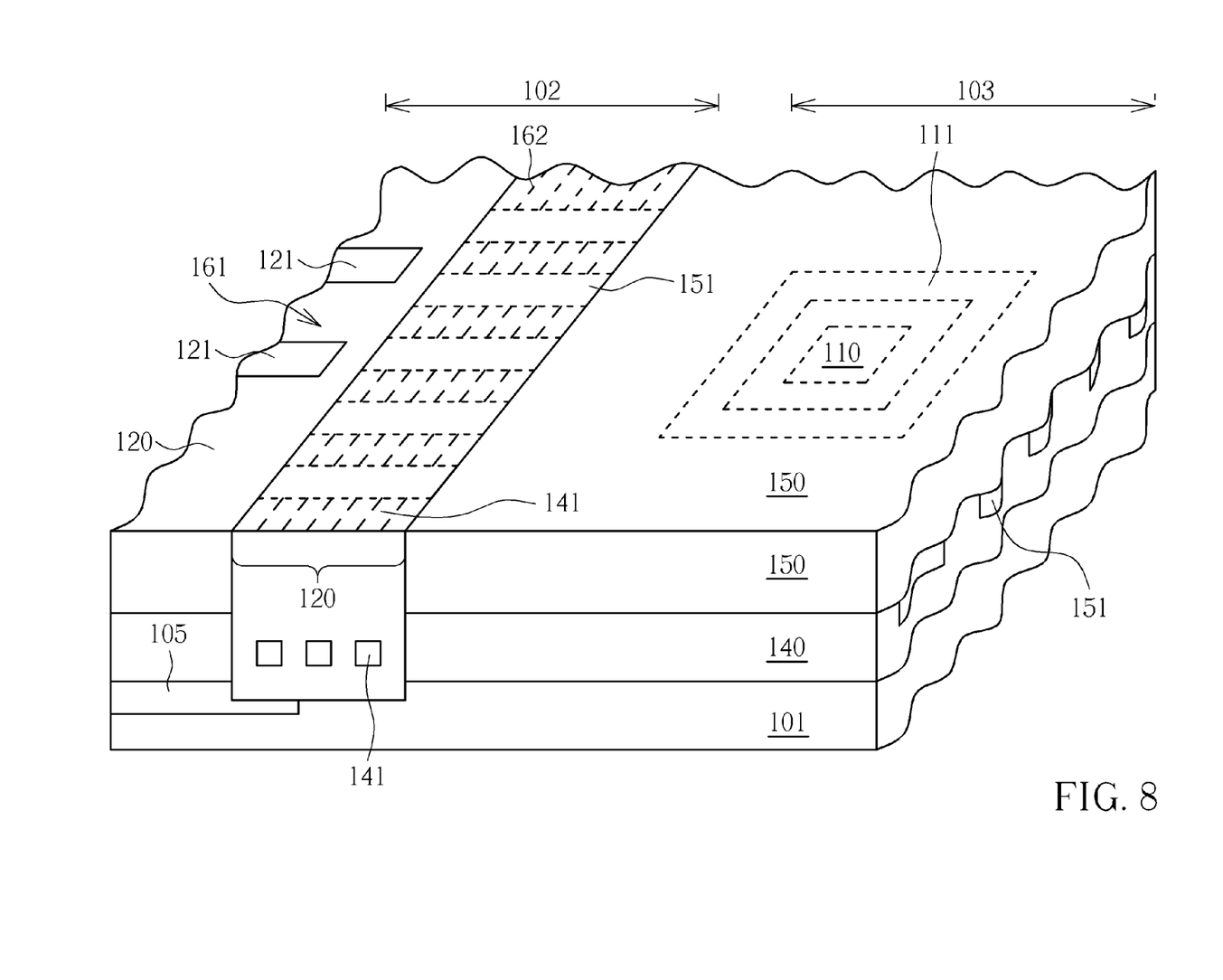
Figure 9:
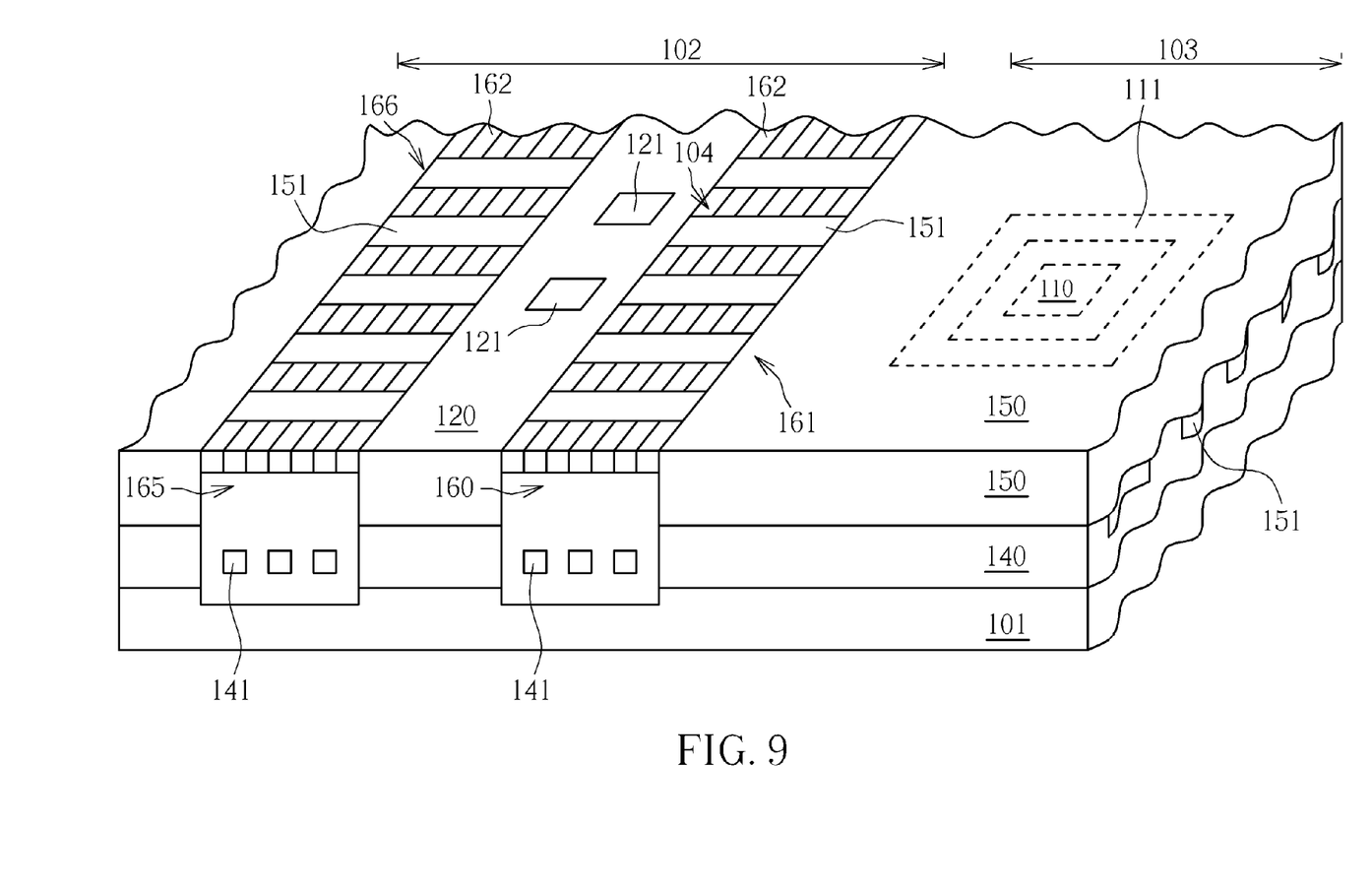
FIG. 9 illustrates the semiconductor structure with the crack stop structure of the present invention.

In another embodiment of the present invention, there may be a shallow trench isolation 105 which is conventionally disposed in the substrate 101. The shallow trench isolation 105 may also be removed at the same time to form the crack stop trench 160. FIG. 8 illustrates the crack stop trench 160 penetrating the shallow trench isolation 105. FIG. 9 illustrates that the shallow trench isolation 105 is not present.

Afterwards, as shown in FIG. 8, the crack stop trench 160 is filled with another dielectric material 162, such as a porous low k material, polyimide, silicon oxide, silicon nitride or silicon oxynitride to form a crack stop structure 161 which is disposed within the scribe line region 102. When test pad 121 is present, the crack stop structure 161 may be disposed between the test pad 121 and the integrated circuit 110.

Preferably, the width of the crack stop trench 160 is not too small: for example, the crack stop trench 160 has a width at least one tenth of that of the scribe line 120.

Optionally, a side crack stop trench 165 may be formed to construct a side crack stop structure 166, as shown in FIG. 9. The side crack stop structure 166 may be disposed inside or outside the scribe line region 102 to assist the crack stop structure 161 within the scribe line region 102. The side crack stop trench 165 and the side crack stop structure 166 may be formed by steps which are similar to those of forming the crack stop trench 160 and the crack stop structure 161.

For example, some of the interlayer dielectric layer 140 and some of the intermetal dielectric layer 150 are removed to form the side crack stop trench 165. If an optional shallow trench isolation 105 is present, the shallow trench isolation 105 may also be removed at the same time. Afterwards, the side crack stop trench 165 is filled with another dielectric material 162, such as a porous low k material, polyimide, silicon oxide, silicon nitride and/or silicon oxynitride to form a side crack stop structure 166.

After the above-mentioned steps, a semiconductor structure 100, which includes a matrix 109, an integrated circuit 110 and a scribe line 120, is formed, as shown in FIG. 9. The matrix 109 includes the scribe line region 102, the circuit region 103, the interlayer dielectric layer 140, the intermetal dielectric layer 150, the optional shallow trench isolation 105, the crack stop trench 160 and the crack stop structure 161. The crack stop trench 160 is adjacent to the circuit region 103 and is parallel with one side of the circuit region 103. The crack stop trench 160 penetrates at least one of the interlayer dielectric layer 140, the intermetal dielectric layer 150 and the optional shallow trench isolation 105 to be embedded in the matrix 109.

The crack stop trench 160 is filled with a composite material in the form of a metal grid 104. The composite material may include two different materials, one of which is preferably softer than the other one. For example, the composite material may be a metal and an insulating material. Alternatively, the composite material may include a first insulating material, a second insulating material, or an optional third insulating material. The metal may include at least one of Cu, Al and W. The insulating material may include at least one of a porous low k material, polyimide, silicon oxide, silicon nitride and silicon oxynitride.

Because the crack stop trench 160 and the optional side crack stop trench 165 are respectively formed in different steps, the formation of the trenches may help to release the stress within the interlayer dielectric layer 140, the intermetal dielectric layer 150 or the substrate 101. Accordingly, the crack stop structure 161 or the side crack stop structure 166 may help to stop the cracking from propagating to the circuit region 103 when the scribe line 120 on the matrix 109 is being diced in order to protect the integrated circuit 110 in the circuit region 103.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a crack stop structure in a scribe line, comprising:
providing a substrate comprising a scribe line region and a circuit region;
forming an integrated circuit within said circuit region;
forming a first layer embedded in said substrate, wherein said first layer is partially disposed within said scribe line region;
forming an interlayer dielectric layer disposed on said substrate and covering said integrated circuit and said first layer;
forming a second layer embedded in said interlayer dielectric layer, wherein said second layer is partially disposed within said scribe line region;
forming an intermetal dielectric layer disposed on said interlayer dielectric layer and covering said second layer;
removing said interlayer dielectric layer and said intermetal dielectric layer which are disposed within said scribe line region to form a crack stop trench, thereby partially exposing said first layer and said second layer; and
filling said crack stop trench with a dielectric material to form a crack stop structure.

2. The method for forming a crack stop structure in a scribe line of claim 1, wherein said dielectric material comprises at least one of a porous low k material, polyimide, silicon oxide, silicon nitride and silicon oxynitride.

3. The method for forming a crack stop structure in a scribe line of claim 1, wherein said crack stop trench has a width at least one tenth of that of said scribe line.

4. The method for forming a crack stop structure in a scribe line of claim 1, wherein said first layer within said scribe line region has an orientation vertical to that of said second layer within said scribe line region to form a metal grid.

5. The method for forming a crack stop structure in a scribe line of claim 1, wherein said first layer within said scribe line region and said second layer within said scribe line region are arranged together in the form of a check board.

6. The method for forming a crack stop structure in a scribe line of claim 1, further comprising:

forming a test pad disposed within said scribe line region so that said crack stop trench is disposed between said test pad and said circuit region.

7. The method for forming a crack stop structure in a scribe line of claim 1, further comprising:

forming a guard ring surrounding said integrated circuit.

8. The method for forming a crack stop structure in a scribe line of claim 1, wherein removing said interlayer dielectric layer and said intermetal dielectric layer further comprises:

removing a shallow trench isolation disposed in said substrate.

9. The method for forming a crack stop structure in a scribe line of claim 1, further comprising:

forming a side crack stop trench by removing said interlayer dielectric layer and said intermetal dielectric layer; and filling said side crack stop trench with said dielectric material to form a side crack stop structure.

* * * * *